(12) United States Patent
Tyner (10) Patent No.: US 12,259,415 B1
(45) Date of Patent: Mar. 25, 2025

(54) INSULATED PANEL FOR ELECTRICAL METER BOX

(71) Applicant: Kenneth Tyner, Port Charlotte, FL (US)

(72) Inventor: Kenneth Tyner, Port Charlotte, FL (US)

( * ) Notice: Subject to any disclaimer, the term of this patent is extended or adjusted under 35 U.S.C. 154(b) by 0 days.

(21) Appl. No.: 18/628,468

(22) Filed: Apr. 5, 2024

Related U.S. Application Data (60) Provisional application No. 63/457,647, filed on Apr. 6, 2023.

(51) Int. Cl.
*G01R 22/06* (2006.01)

(52) U.S. Cl.
CPC .................. *G01R 22/065* (2013.01)

(58) Field of Classification Search
CPC .... G01R 11/02; G01R 11/04; G01R 22/00–10
See application file for complete search history.

(56) References Cited

U.S. PATENT DOCUMENTS

| | | | |
|---|---|---|---|
| 3,358,866 A | 12/1967 | Kinney | |
| 3,458,768 A | 7/1969 | Schubert | |
| 3,585,456 A | 6/1971 | Phillips, Jr. | |
| 3,628,097 A | 12/1971 | Kobryner | |
| 3,735,332 A | 5/1973 | Tirrell | |
| 3,744,010 A * | 7/1973 | Meacham | H02B 1/03 439/301 |
| 3,837,521 A * | 9/1974 | Huston | G01F 15/14 220/3.3 |
| 4,134,636 A | 1/1979 | Kleinatland et al. | |
| 4,142,225 A | 2/1979 | Diersing et al. | |
| 4,404,521 A | 9/1983 | Fennell | |
| 4,505,530 A | 3/1985 | Fennel | |
| 4,688,149 A | 8/1987 | Inoue et al. | |
| 4,819,129 A * | 4/1989 | Erickson | H02B 1/06 324/156 |
| 6,159,041 A * | 12/2000 | Davis | H01R 13/567 439/942 |
| 7,614,908 B2 | 11/2009 | Zhang | |
| 10,181,800 B1 | 1/2019 | Nayar et al. | |
| 2002/0108319 A1* | 8/2002 | Bernard | B65D 90/00 52/79.1 |
| 2009/0061679 A1* | 3/2009 | Zhang | G01R 11/04 439/517 |
| 2016/0215997 A1* | 7/2016 | Carlyon | B32B 7/05 |
| 2016/0298381 A1* | 10/2016 | Anderson, Jr. | F24F 13/14 |
| 2016/0359308 A1* | 12/2016 | Vezina | H05K 5/0204 |

FOREIGN PATENT DOCUMENTS

| | | | |
|---|---|---|---|
| CN | 110376409 A | * | 10/2019 |
| EP | 3 517 002 A1 | | 7/2019 |

* cited by examiner

*Primary Examiner* — Huy Q Phan
*Assistant Examiner* — David B Frederiksen
(74) *Attorney, Agent, or Firm* — Frijouf, Rust & Pyle, P.A.

(57) ABSTRACT

An insulated panel is disclosed for an electrical meter box. The insulated panel comprises an insulated base panel positioned adjacent to an interior side wall of a base wall. An insulated side panel is positioned adjacent to an interior side wall of one or more plurality of side walls. The insulated base panel and the insulated side panel define an insulated layer within the electrical meter box. The insulated layer prevents electrical continuity of the electrical components through the electrical meter box.

16 Claims, 11 Drawing Sheets

FIG. 29

INSULATED PANEL FOR ELECTRICAL METER BOX

CROSS-REFERENCE TO RELATED APPLICATIONS

This application claims benefit of U.S. Patent Provisional application No. 63/457,647 filed Apr. 6, 2023. All subject matter set forth in provisional application No. 63/457,647 is hereby incorporated by reference into the present application as if fully set forth herein.

BACKGROUND OF THE INVENTION

Field of the Invention

This invention relates to insulators and more particularly to an insulated panel for an electrical meter box.

Background of the Invention

Commercial and residential structures that require electrical service must include an electrical meter to measure the electrical consumption of the structure. The electrical meter is most often housed in an electrical meter box. The electrical meter box provides for an electrical connection for receiving the incoming electrical power lines and the outgoing electrical power supply lines to the commercial or residential structure. Typically the electrical meter box is constructed of a metallic electrical conductive material. If the electrical components including the electrical lines become dislodged within the electrical meter box and make contact with the conductive electrical meter box, a potentially hazardous electrical short may result. This electrical short made proved to be a fire hazard or an electrical shock hazard.

There have been many in the prior art who have attempted to solve these problems with varying degrees of success. None, however completely satisfies the requirements for a complete solution to the aforestated problem. The following U.S. Patents are attempts of the prior art to solve this problem.

U.S. Pat. No. 3,358,866 to Kinney discloses a molded insulation electrical wiring box including integral ear portions containing convergent nail-guiding passageways, whereby the box may be readily nailed to a support.

U.S. Pat. No. 3,458,768 to Schubert discloses a unitary housing adapted to mount a kilowatt-hour meter and contains a combination pull-out switch and fuse-holder assembly. The unit has a modular construction for employment in large numbers in installations requiring a large number of metered branches. Structural features provide economy of construction and installation, as well as safety.

U.S. Pat. No. 3,585,456 to Phillips, Jr. discloses an electric service center having a housing adapted to extend a predetermined distance above its installation in the ground to provide electrical service to mobile homes and the like. The housing is adapted to receive a removable plate which carries one or more plug receptacles and one or more circuit breakers. A neutral connection is also carried by the plate. The plug receptacle, circuit breaker and neutral connection are electrically coupled together. When secured to the housing, the plate's circuit breaker and neutral connection are electrically coupled to a source of power through bus bars. The service ampere rating is changed by removing the plate and substituting a plate having a plug receptacle, neutral connection and a circuit breaker with the desired rating. An alternate embodiment provides sidewalls on either side of each plate to protect the plate's circuit breaker, neutral connection and plug receptacle. A rain guard is also provided on each plate to protect its circuit breaker and plug receptacle. Bus bars within the housing are disposed in rigid tubes to prevent inadvertent contact of the bus bars with, for example, the sidewalls of the plates. An insulating sheet in the housing between the bus bars and the opening in the housing for the removable plates provides further protection for a user.

U.S. Pat. No. 3,628,097 to Kobryner discloses an employment of plural elongated bus bars in laterally spaced parallel relation extending to serve, in common, a plurality of horizontally adjacent meter-mounting zones, where different load circuits have branch connection, via their respective meters, to the bus bar lines. The bus bar assembly is unitarily mounted in an elongated meter box within which all meter-mounting zones are defined between opposed end or live supply wiring zones. The bus bar ends, where live line connections are made, are carried by insulating spacer blocks on the base or floor of the box. At each meter-mounting zone, insulating means straddles or overstands the bus bars and carries both the live jaws and the load jaws for the stab configuration of a standard plug-in meter. Various different employments of the box, in single-phase branching of single-phase and three-phase supply lines, with and without grounded neutral, will be described.

U.S. Pat. No. 3,735,332 to Tirrell discloses an integral rectangularly prismatic cup-shaped insulating jacket having a cavity shape which is adaptable for end-wise insertion over the projecting end of a stab-type meter jaw or the like. The jacket has integral formations having detent interference with the jaw over which it is inserted, thereby rendering the jacket self-retaining in its assembled relation to the jaw. The ""closed"" end of the jacket is characterized by a limited stab-receiving and guiding opening, between end-wall portions which effectively cover the projecting outer limits of the jaw.

U.S. Pat. No. 4,134,636 to Kleinatland et al. discloses a combination of an electrical outlet box with an under plate wherein the outlet box has end walls and side walls and the under plate is a molded plastic insulator panel having a center tubular portion sized for telescopic engagement with the outlet box, the center portion being a continuous wall defining an open center area in the plate, and the plate having a continuous peripheral portion for engaging a building surface when the outlet box is positioned in a hole in such surface, and the center portion insulating terminal portions of an associated outlet receptacle.

U.S. Pat. No. 4,142,225 to Diersing et al. discloses a panel board assembly comprising a plurality of modular insulators each having an integrally formed resilient bead for engaging a circuit breaker housing recess to support a circuit breaker. A tongue on each insulator assists in disengaging the circuit breaker from the bead. Longitudinally extending bus bars are supported by the insulators in heat transmitting relationship to the metal wall of an enclosure. The insulators have long surface paths between adjacent bus bars and bus stabs to prevent electrical leakage. A neutral assembly in close space saving relationship to the bus bars and for convenient wiring is provided together with partition walls between phase bus bars and between individual bus stabs.

U.S. Pat. No. 4,404,521 to Fennell discloses a pilfer proofing system and method for electric meter boxes having a meter base box, which carries a plug-in terminal block set and a meter box cover having an opening through which a plug-in-meter passes to engage contact jaws or sockets the terminal block set. An anchoring bar is secured to the meter stops and a conventional meter locking collar is secured to the cover and the bridge of the locking collar is secured to the anchoring bar. Metal extension adaptors are secured to the meter blades for entering into the contact jaws or sockets of the terminal block set and a conventional locking ring is utilized to lock the meter in place on the added meter collar thereby providing a substantial obstacle to easy pilfering of electricity. A safety device constituted by a handle, a flexible insulating sheet and a set of nonconductive blades is inserted in the socket blades of the terminal block set and retained therein by friction covering up the hot or live terminals of the terminal block set with the flexible insulating sheet, and it is removed by grasping the handle and removing same.

U.S. Pat. No. 4,505,530 to Fennell discloses a pilfer proofing system and method for electric meter boxes having a meter base box, which carries a plug-in terminal block set and a meter box cover having an opening through which a plug-in-meter passes to engage contact jaws or sockets the terminal block set. An anchoring bar is secured to the meter stops and a conventional meter locking collar is secured to the cover and the bridge of the locking collar is secured to the anchoring bar. Metal extension adaptors are secured to the meter blades for entering into the contact jaws or sockets of the terminal block set and a conventional locking ring is utilized to lock the meter in place on the added meter collar thereby providing a substantial obstacle to easy pilfering of electricity. A safety device constituted by a handle, a flexible insulating sheet and a set of nonconductive blades is inserted in the socket blades of the terminal block set and retained therein by friction covering up the hot or live terminals of the terminal block set with the flexible insulating sheet, and it is removed by grasping the handle and removing same.

U.S. Pat. No. 4,688,149 to Inoue et al. discloses an electrical junction system for automotive internal wiring has a wiring board provided with branching conductors formed by a multiplicity of bus bars on an insulation plate, the branching conductors being adapted to be connected to electric wires in a wiring harness to form branching electric circuits. The electrical junction system has a printed circuit board detachably mounted on the wiring board, the printed circuit board generally or inclusively carrying a plurality of circuits incorporating a multiplicity of function parts which are used semi-permanently such as relays and associated control elements.

U.S. Pat. No. 7,614,908 to Zhang discloses an insulating meter jaw guide featuring a loop belt, a retaining fastener, a meter blade receiving slot, and a cavity housing. The insulating meter jaw guide may be positioned on a meter jaw of watt-hour meter socket, effectively covering the receiving end of a meter jaw or a meter jaw assembly, therefore, protecting the meter jaw from accidental contact by a meter cover or the like.

U.S. Pat. No. 10,181,800 to Nayar et al. discloses systems and methods for electrically coupling energy storage devices to an external load or power source. Examples of such coupling include connecting energy storage devices to an electric power grid using a power conversion system with suitable characteristics including, for example, active/real power and reactive power control capabilities, response time, current, voltage, phase, frequency, fault protection and/or information exchange protocols. The power conversion system can include an inverter.

Although the aforementioned prior art have contributed to the development of the art of insulating an electrical enclosure none of these prior art patents have solved the needs of this art.

Therefore, it is an object of the present invention to provide an improved insulated panel which is a significant advancement over the prior art.

Another object of this invention is to provide an improved insulated panel which may be utilized within an electrical meter box.

Another object of this invention is to provide an improved security anchor that may be utilized with new construction.

Another object of this invention is to provide an improved security anchor that may be utilized with existing construction.

Another object of this invention is to provide an improved security anchor that is easy to cost effectively produce.

The foregoing has outlined some of the more pertinent objects of the present invention. These objects should be construed as being merely illustrative of some of the more prominent features and applications of the invention. Many other beneficial results can be obtained by modifying the invention within the scope of the invention. Accordingly other objects in a full understanding of the invention may be had by referring to the summary of the invention, the detailed description describing the preferred embodiment in addition to the scope of the invention defined by the claims taken in conjunction with the accompanying drawings.

SUMMARY OF THE INVENTION

The present invention is defined by the appended claims with specific embodiments being shown in the attached drawings. For the purpose of summarizing the invention, the invention relates to an improved insulated panel for an electrical meter box. The electrical meter box has a base wall, a plurality of side walls. Each of the plurality of side walls include an interior side wall and an exterior side wall. The electrical meter box defines an meter box chamber and houses electrical components. The insulated panel comprises an insulated base panel positioned adjacent to the interior side wall of the base wall. An insulated side panel is positioned adjacent to the interior side wall of one or more of the plurality of side walls. The insulated base panel and the insulated side panel define an insulated layer within the electrical meter box. The insulated layer prevents electrical continuity of the electrical components through the electrical meter box.

In a more specific embodiment of the invention, the insulated base panel and the insulated side panel define an integral one piece unit.

In another embodiment of the invention, a linear perforation is between the insulated base panel and the insulated side panel for defining a living hinge and aiding in pivoting the insulated side panel relative to the insulated base panel.

In another embodiment of the invention, an adhesive panel is coupled to the insulated base panel and the insulated side panel for coupling the insulated base panel and the insulated side panel to the interior side wall of the base wall and a side wall respectively.

In another embodiment of the invention, the insulated base panel and the insulated side panel are constructed of neoprene rubber, silicon coated fiberglass, heat resistant vinyl, plyvinyl chloride or synthetic rubber.

The foregoing has outlined rather broadly the more pertinent and important features of the present invention in order that the detailed description that follows may be better understood so that the present contribution to the art can be more fully appreciated. Additional features of the invention will be described hereinafter which form the subject of the claims of the invention. It should be appreciated by those skilled in the art that the conception and the specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be made to the following detailed description taken in connection with the accompanying drawings in which.

Similar reference characters refer to similar pans throughout the several Figures of the drawings.

DETAILED DISCUSSION

FIGS. 1-3, 8, 10-24 and 26-29 illustrate an insulated panel 10 for an electrical meter box 20. The electrical meter box 20 as shown in FIGS. 4-7, 9-13 and 25-29 has a base wall 22, a first side wall 24, a second side wall 26, an upper wall 28 and a lower wall 30. Each of the walls include an interior side wall 32 and an exterior side wall 34. The electrical meter box 20 defines a meter box chamber 36 and houses electrical components 38. The electrical meter box 20 may include punch out meter box apertures 42 for engaging with the electrical conduit. Furthermore, the electrical meter box 20 may include mounting apertures 44 for securing the electrical meter box 20 to a structure.

The electrical meter box 20 serves to engage an electrical meter for measuring the electrical consumption of a device. The electrical meter box 20 provides an electrical housing for coupling an incoming electrical power line and an outgoing electrical power line. A meter socket base 40 provides support for the electrical meter. Furthermore, the meter socket base 40 provides support for electrical lugs which engages the incoming and outgoing electrical power lines. Typically, the electrical meter box 20, is constructed of a metallic and electrically conductive material. The electrical meter box 20 is typically coated with a layer of paint to prevent corrosion. If the incoming or outgoing electrical power lines become disengaged from the electrical lugs and make contact with the electrical meter box 20, a potentially hazardous electrical short may result. This electrical short may prove to be a fire hazard or an electrical shock hazard for individuals.

The insulated panel 10 which incorporates the present invention is intended to prevent the potentially hazardous electrical short as mentioned above. The insulated panel 10 comprises an insulated base panel 50 positioned adjacent to the interior side wall 32 of the base wall 22. An insulated first side panel 52 may be positioned adjacent to the interior side wall 32 of the first side wall 24. An insulated second side panel 54 may be positioned adjacent to the interior side wall 32 of the second side wall 26. An insulated upper panel 56 may be positioned adjacent to the interior side wall 32 of the upper wall 28. An insulated lower panel 58 baby positioned adjacent to the interior side wall 32 of the lower wall 30.

The insulated base panel 50, the insulated first side panel 52, the insulated second side panel 54, the insulated upper panel 56 and the insulated lower panel 158 defining an insulated box 60 positioned within the electrical meter box defining an insulated chamber 62. The insulated box 60 houses the electrical components 38 and prevents electrical continuity of the electrical components 38 through the electrical meter box 20. As shown in FIGS. 1-3, 8, 10-13, the insulated base panel 50, the insulated first side panel 52, the insulated second side panel 54, the insulated upper panel 56 and the insulated lower panel 58 may define an integral one piece unit 70. However, as illustrated in FIGS. 14-24 and 26-29, the insulated panel 10 may be constructed of individual insulated panels 120.

As shown in FIGS. 1-3, 8, 10-13, the insulated panel 10 may further include a linear perforation 72 between the insulated base panel 50 with the insulated first side panel 52, the insulated second side panel 54, the insulated upper panel 56 and the insulated lower panel 58 for defining a living hinge 74. The linear perforations 72 aid in pivoting the insulated first side panel 52, the insulated second side panel 54, the insulated upper panel 56 and the insulated lower panel 58 relative to the insulated base panel 50.

Figures 1, 2:
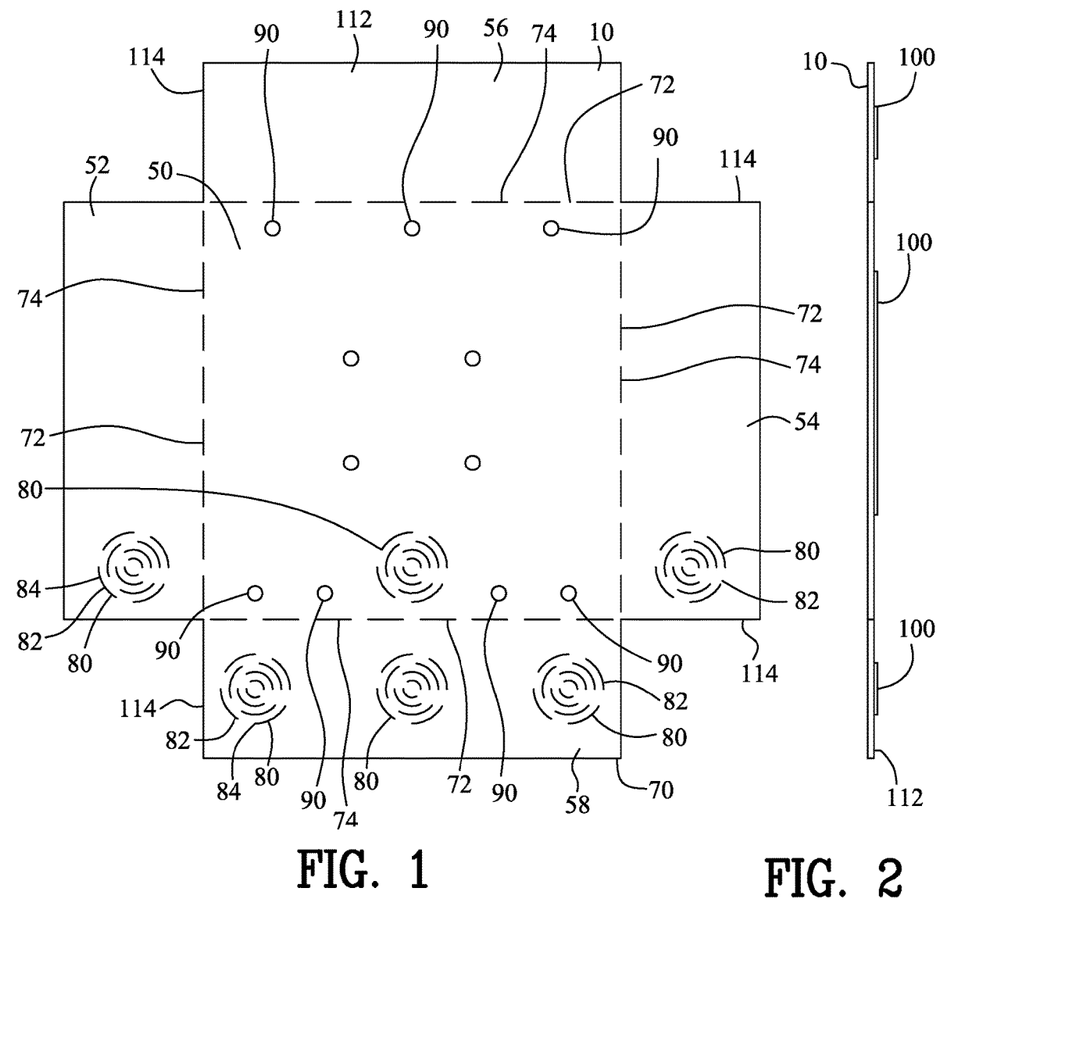
FIG. 1 is a front view of a first embodiment of an insulated panel incorporating the present invention.
FIG. 2 is a side view of FIG. 1.
Figure 3:
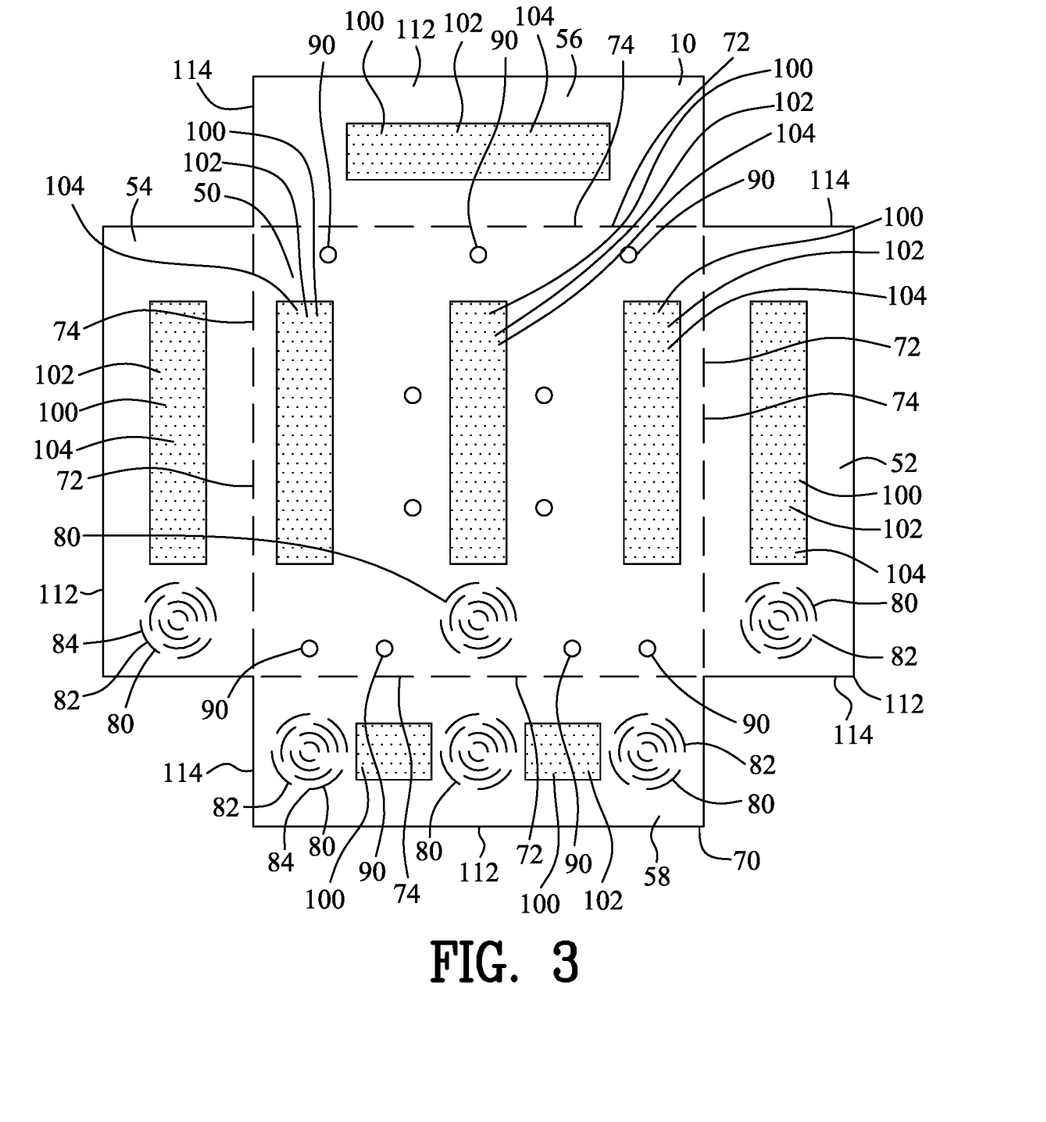
FIG. 3 is a rear view of FIG. 1.
Figure 4:
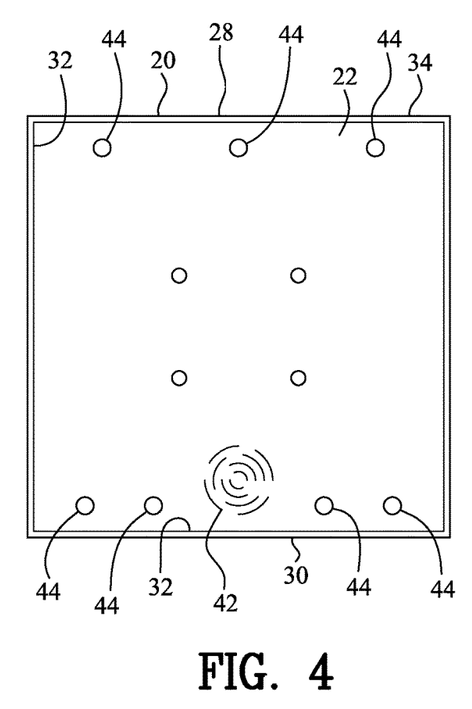
FIG. 4 is a front view of an electrical meter box.
Figure 5:
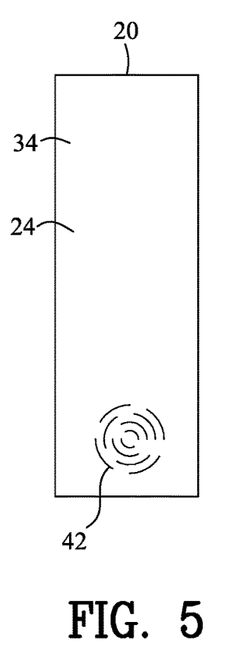
FIG. 5 is a left side view of FIG. 4.
Figure 6:
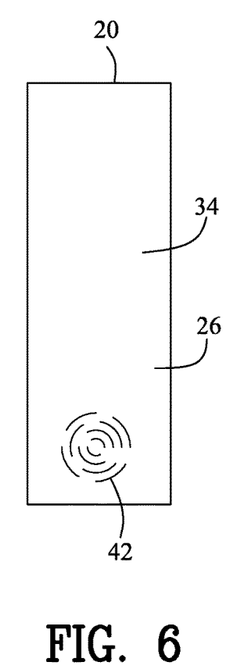
FIG. 6 is a right side view of FIG. 4.
Figure 7:
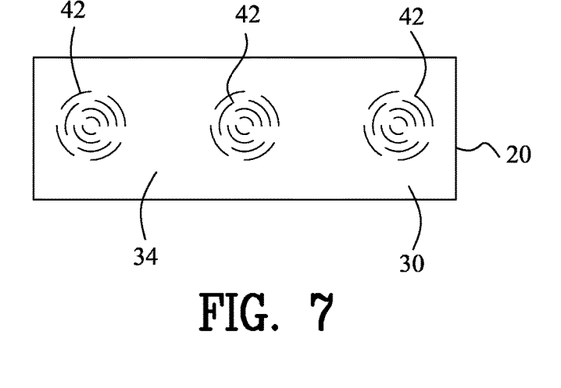
FIG. 7 is a bottom view of FIG. 4.
Figure 8:
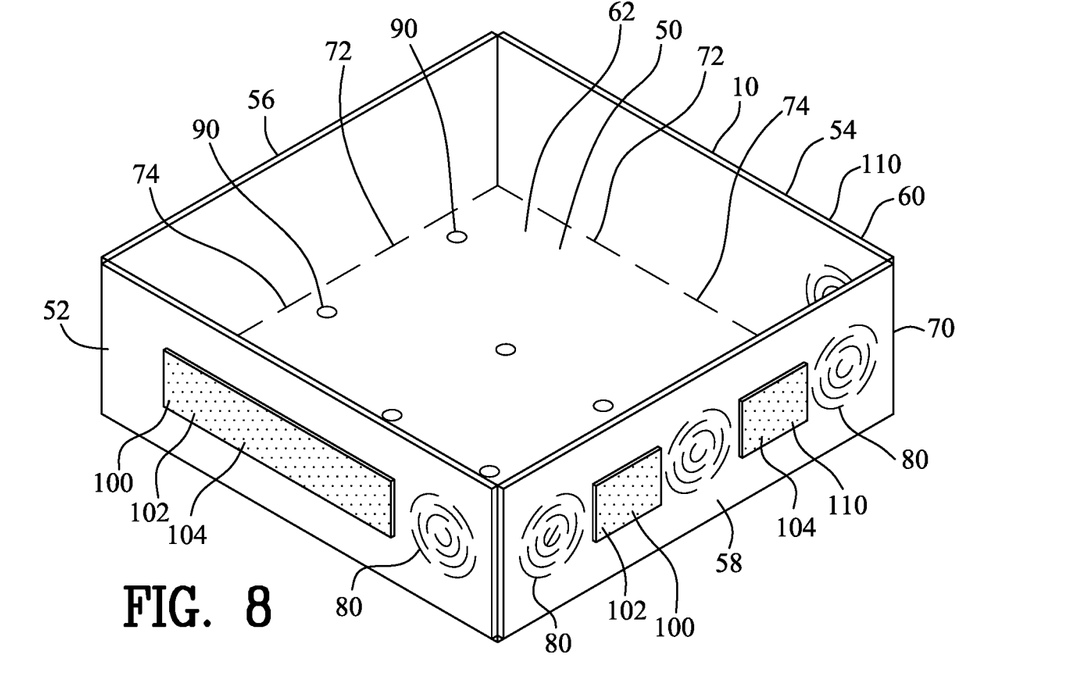
FIG. 8 is an isometric view of the insulated panel in FIG. 1 illustrating portions of the insulated panel pivoted to define an insulated box.
Figure 9:
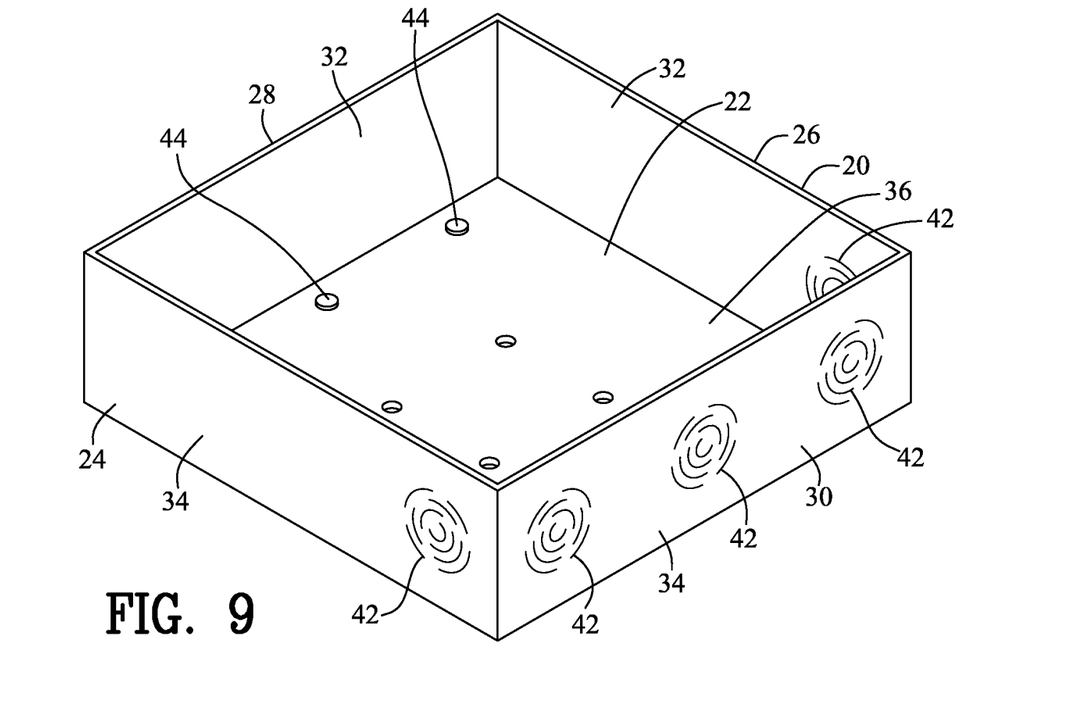
FIG. 9 is an isometric view of FIG. 4.
Figure 10:
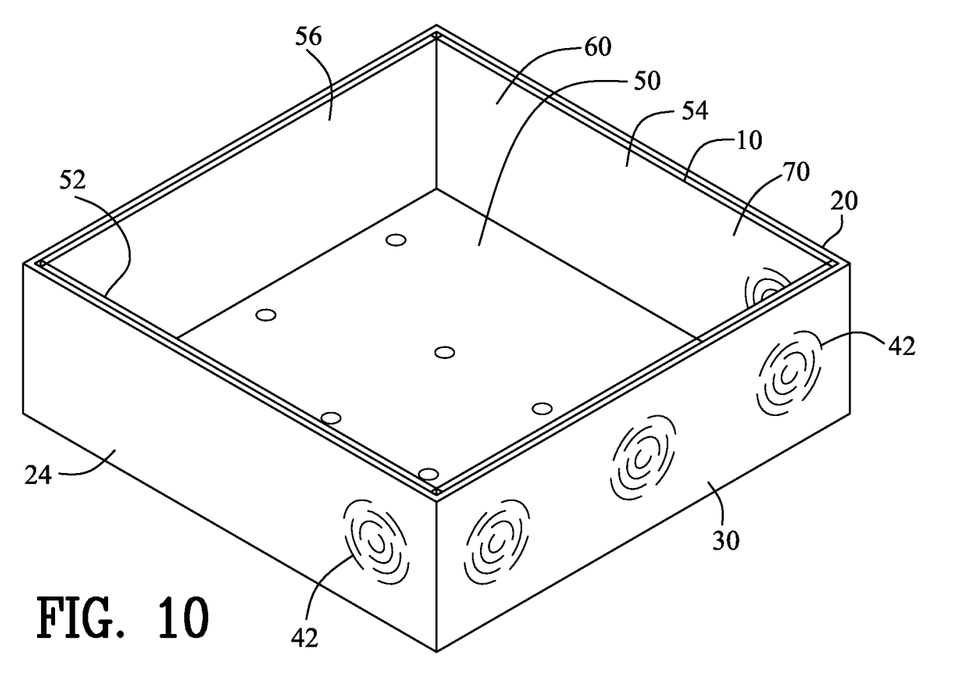
FIG. 10 is a view similar to FIG. 8 illustrating the insulated box positioned within the electrical meter box.
Figure 11:
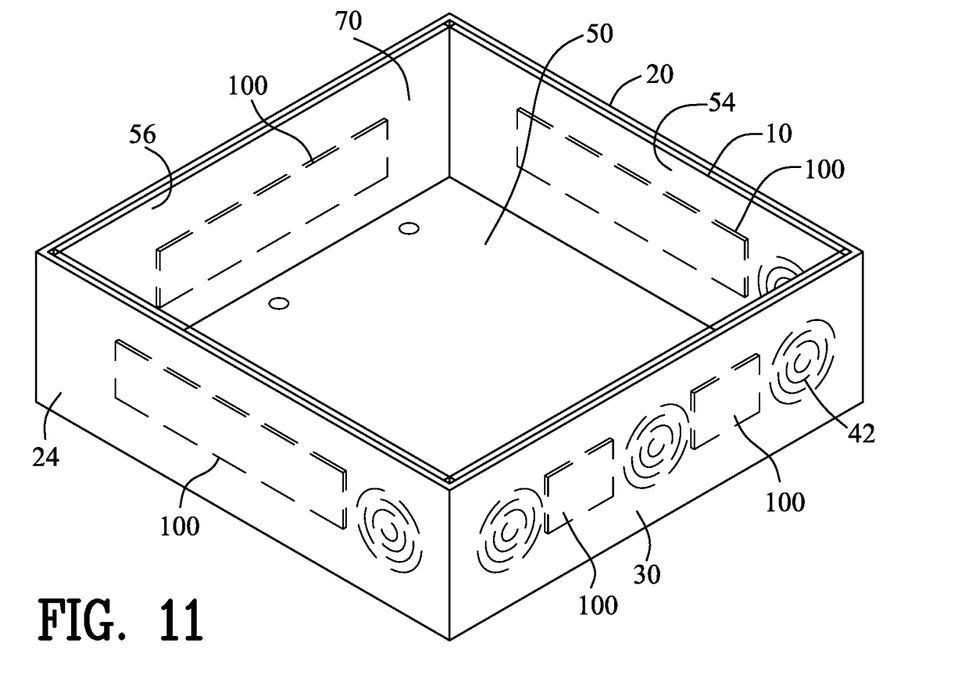
FIG. 11 is a view similar to FIG. 10 illustrating a plurality of adhesive panels coupling the insulated box to the electrical meter box.
Figure 12:
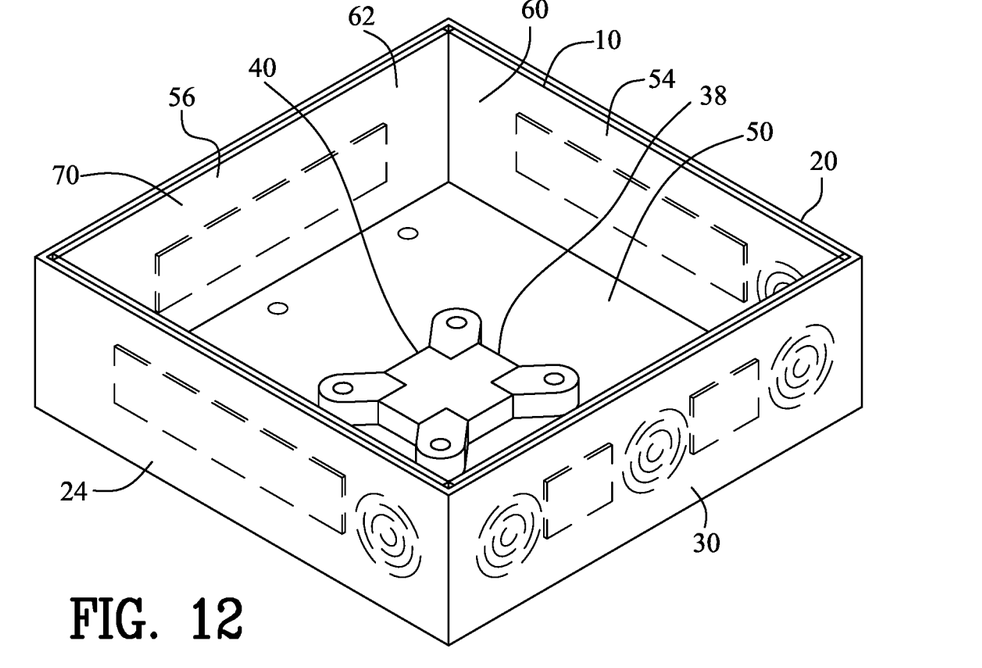
FIG. 12 is a view similar to FIG. 11 illustrating an electrical component positioned adjacent to the insulated panel.

Depending upon the dimensions of the electrical meter box 20, the insulated base panel 50, the insulated first side panel 52, the insulated second side panel 54, the insulated upper panel 56 and the insulated lower panel 58 may define a rectangle panel 112. As best shown in FIGS. 1 and 3, if the insulated panel 10 is utilized as the integral one piece unit 70, a L-shaped notch 114 may be defined between the insulated first side panel 52, the insulated second side panel 54, the insulated upper panel 56 and the insulated lower panel 58 for creating the insulated box 60 upon pivoting the insulated first side panel 52, the insulated second side panel 54, the insulated upper panel 56 and the insulated lower panel 58 relative to the insulated base. An adhesive tape, such as electrical tape, may be utilized on the corners of the insulated box 22 couple the edges of the insulated first side panel 52, the insulated second side panel 54, the insulated upper panel 56 and the insulated lower panel 58.

The insulated panel 10 may further include a circular perforation 80 in the insulated base panel 50, the insulated first side panel 52, the insulated second side panel 54, the insulated upper panel 56 and the insulated lower panel 58 for facilitating removal of circular panel portions 82 and creating circular apertures 84. The circular perforations 80 are intended for aligning with the punch out meter box apertures 42 of the electrical meter box 20. As such, the electrical wires exiting an electrical conduit that is coupled to the electrical meter box 20 may not be inhibited by the insulated panel 10. The circular perforations 80 may include multiple concentric circular perforations such that varying circular aperture 84 diameters may be selected based on the size of the electrical conduit diameter.

The insulated panel may further include a plurality of marks 90 in the insulated base panel 50 for indicating location of anchoring apertures 44 in the electrical meter box 20. The plurality of marks 90 are intended for aligning with the mounting apertures 44 within the base wall 22 of the electrical meter box 20. The plurality of marks 90 facilitate the traversing of the fasteners through the insulated base panel 50 and into the mounting apertures 44 four anchoring to an external structure. The plurality of marks 90 may include an O shape, X shape or other markings.

Figure 13:
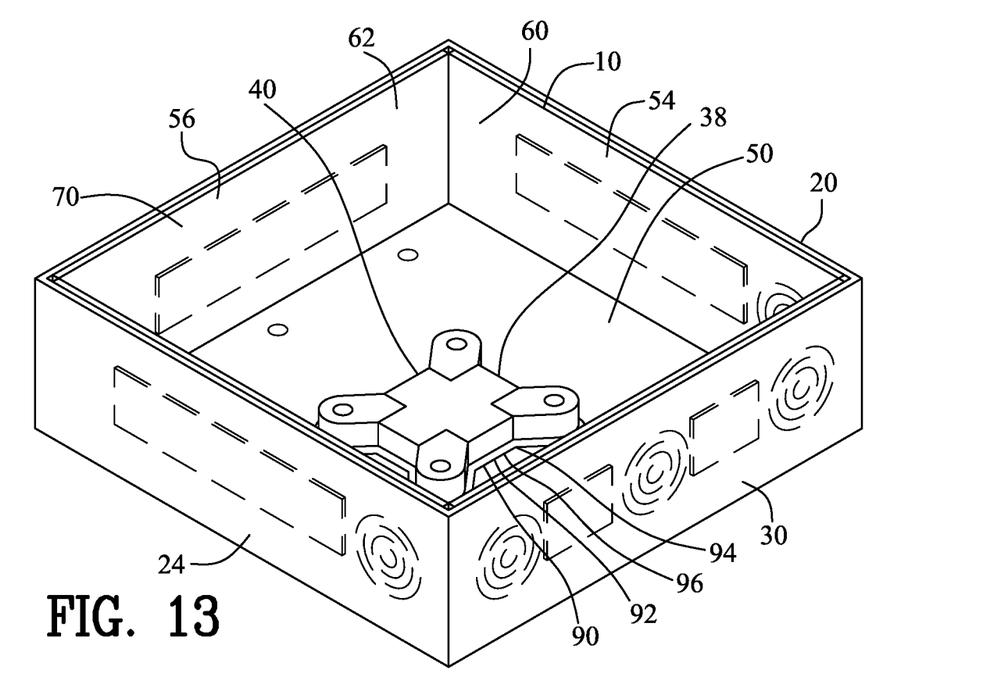
FIG. 13 is a view similar to FIG. 12 illustrating a base aperture in the insulated panel for permitting the electrical component to directly engage with the electrical meter box.
Figures 14, 16:
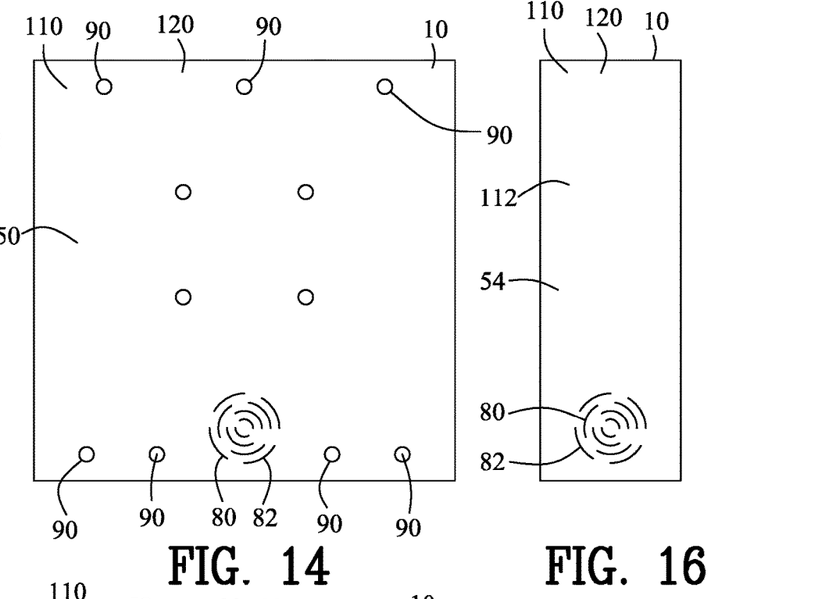
FIG. 14 is a front view of a second embodiment of an insulated base panel incorporating the present invention.
FIG. 16 is a front view of the second embodiment of an insulated second side panel incorporating the present invention.
Figure 15:
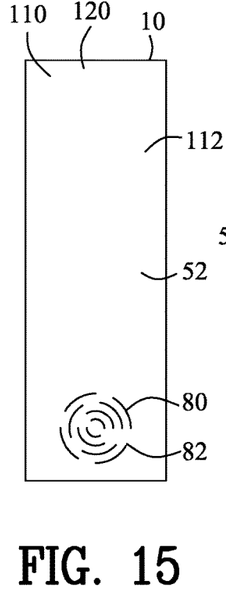
FIG. 15 is a front view of the second embodiment of an insulated first side panel incorporating the present invention.
Figure 17:
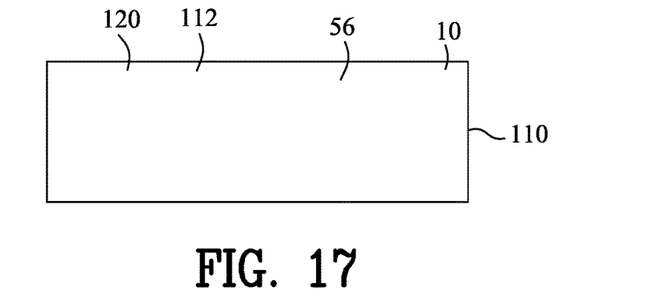
FIG. 17 is a front view of the second embodiment of an insulated upper panel incorporating the present invention.
Figure 18:
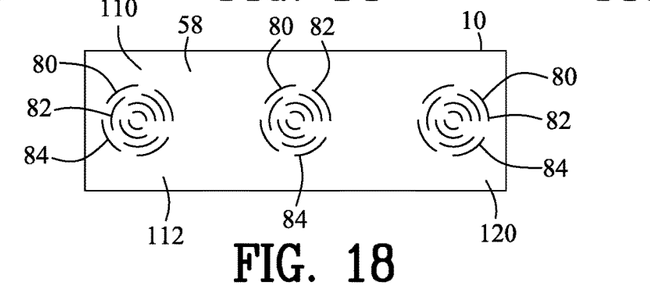
FIG. 18 is a front view of the second embodiment of an insulated lower panel incorporating the present invention.
Figures 19, 20, 21:
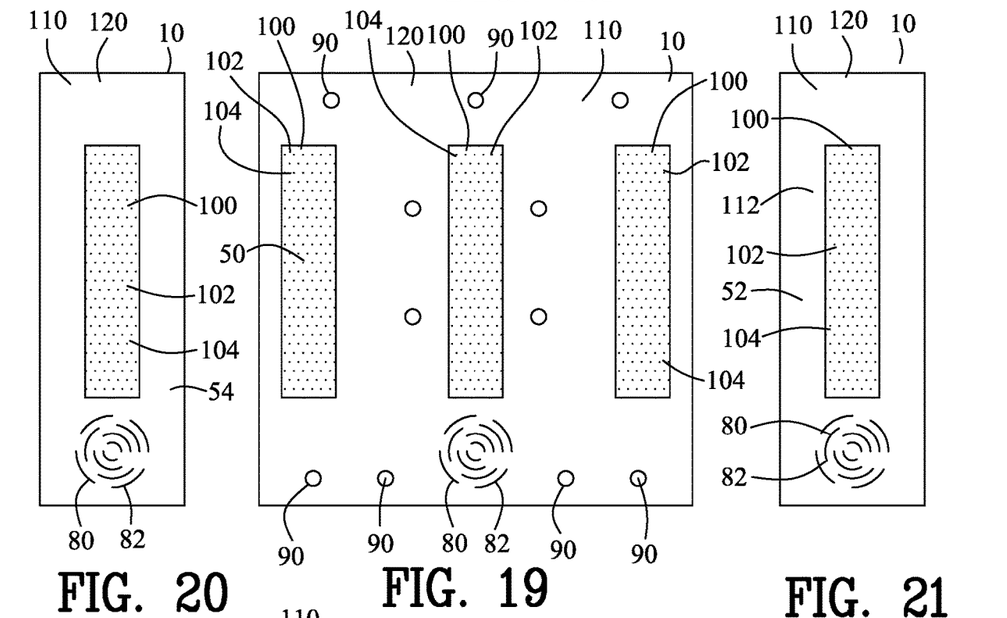
FIG. 19 is a rear view of FIG. 14.
FIG. 20 is a rear view of FIG. 15.
FIG. 21 is a rear view of FIG. 16.
Figure 22:
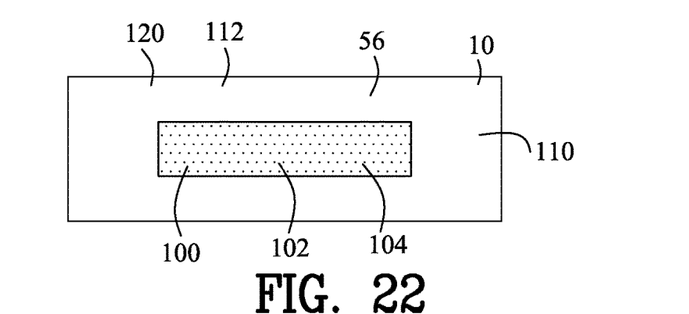
FIG. 22 is a rear view of FIG. 17.
Figure 23:
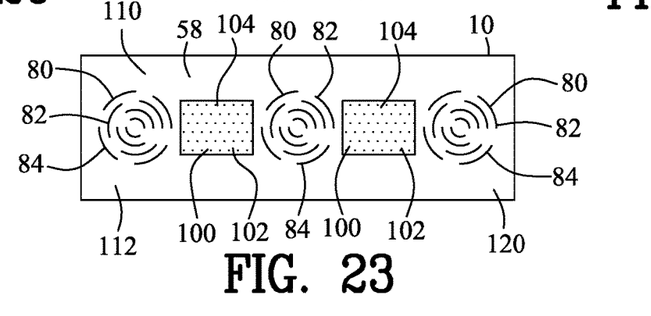
FIG. 23 is a rear view of FIG. 18.
Figure 24:
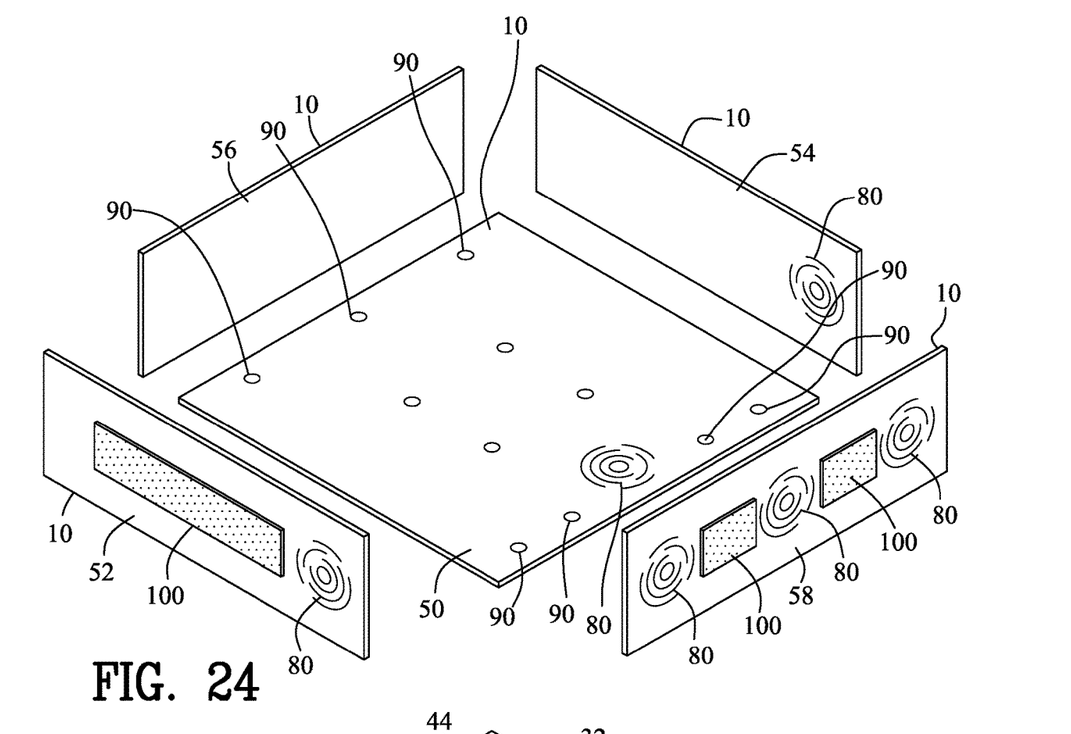
FIG. 24 is an isometric view of the insulated panels in FIGS. 14-18 illustrating portions of the insulated panel positioned to define an insulated box.
Figure 25:
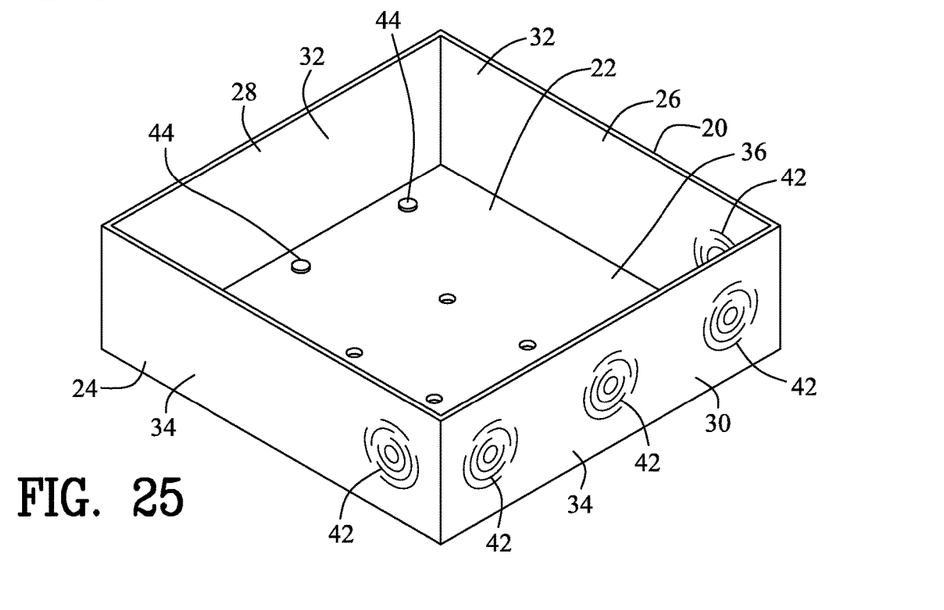
FIG. 25 is an isometric view of FIG. 4.
Figure 26:
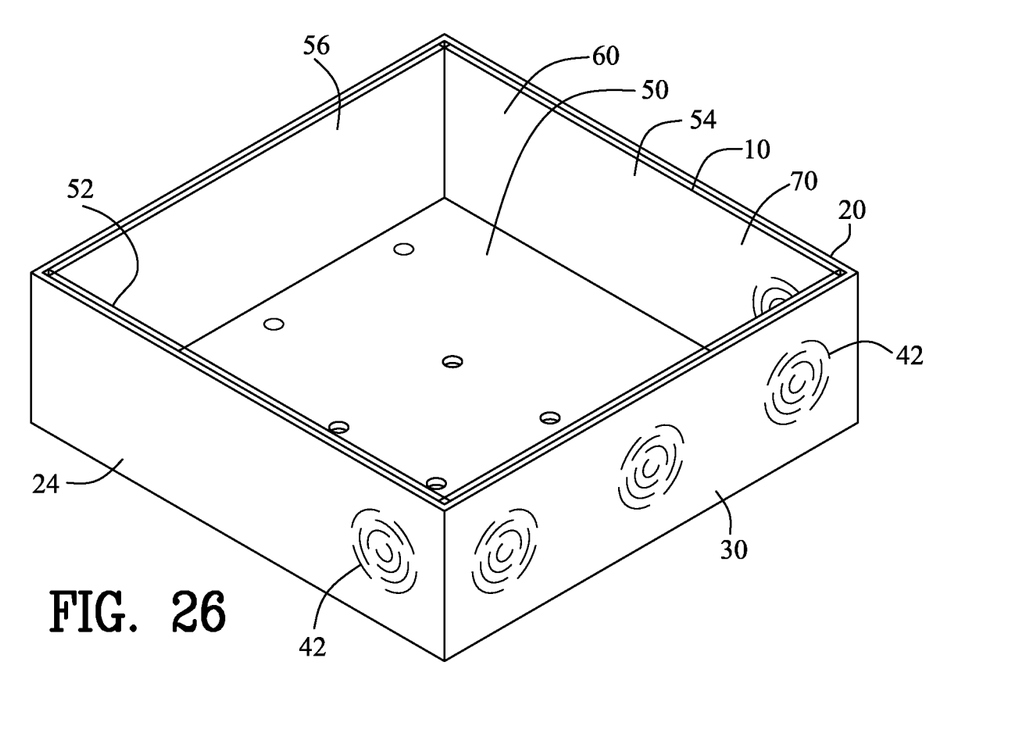
FIG. 26 is a view similar to FIG. 24 illustrating the insulated box positioned within the electrical meter box.
Figure 27:
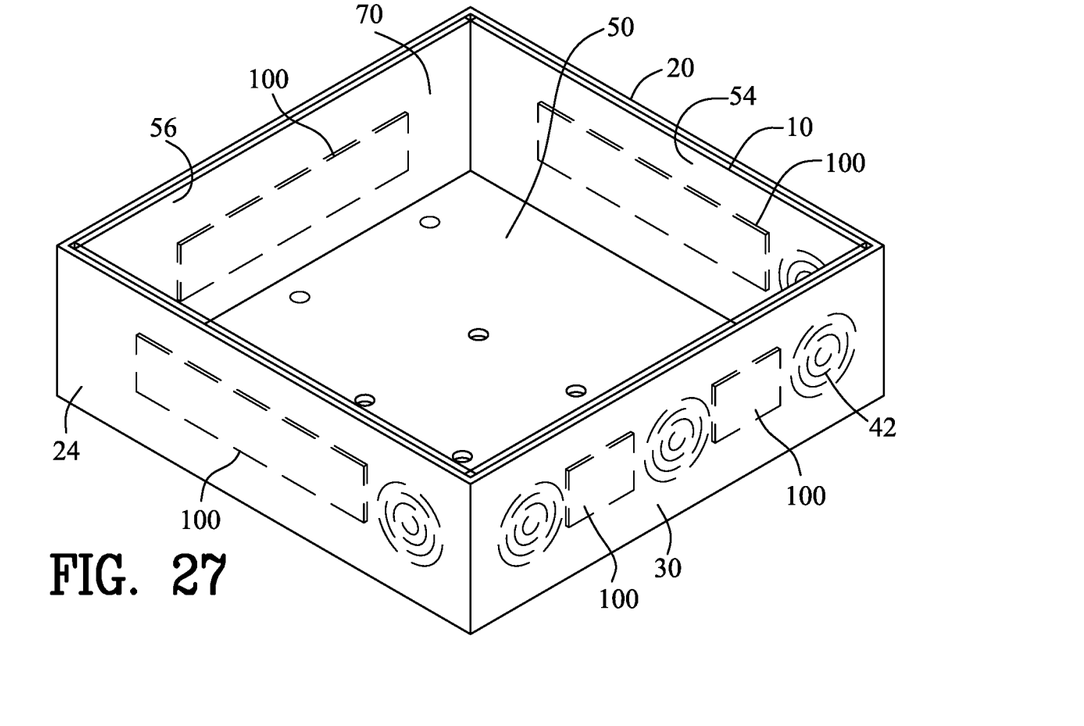
FIG. 27 is a view similar to FIG. 26 illustrating a plurality of adhesive panels coupling the insulated box to the electrical meter box.
Figure 28:
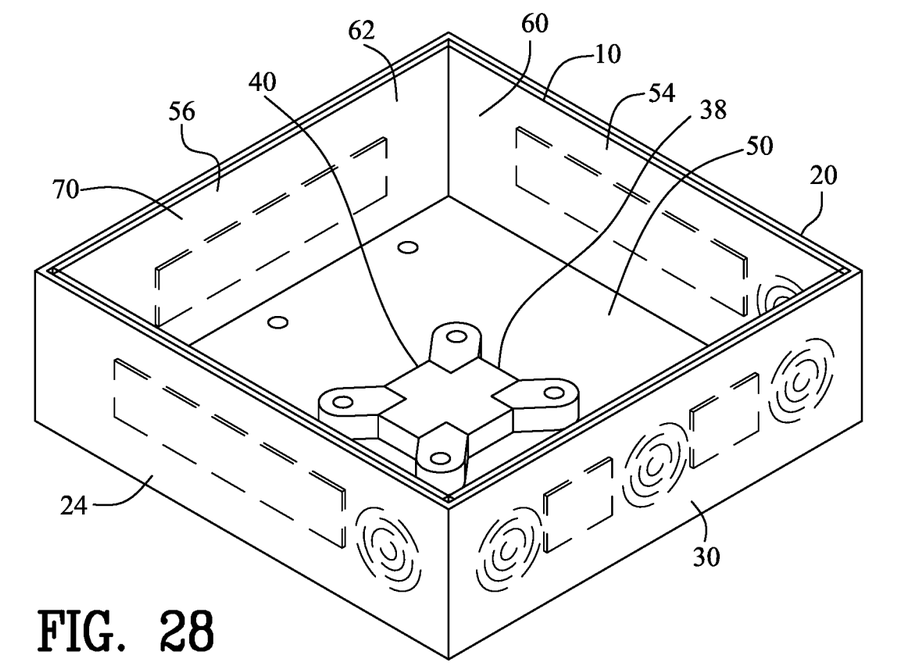
FIG. 28 is a view similar to FIG. 27 illustrating an electrical component positioned adjacent to the insulated panel.
Figure 29:
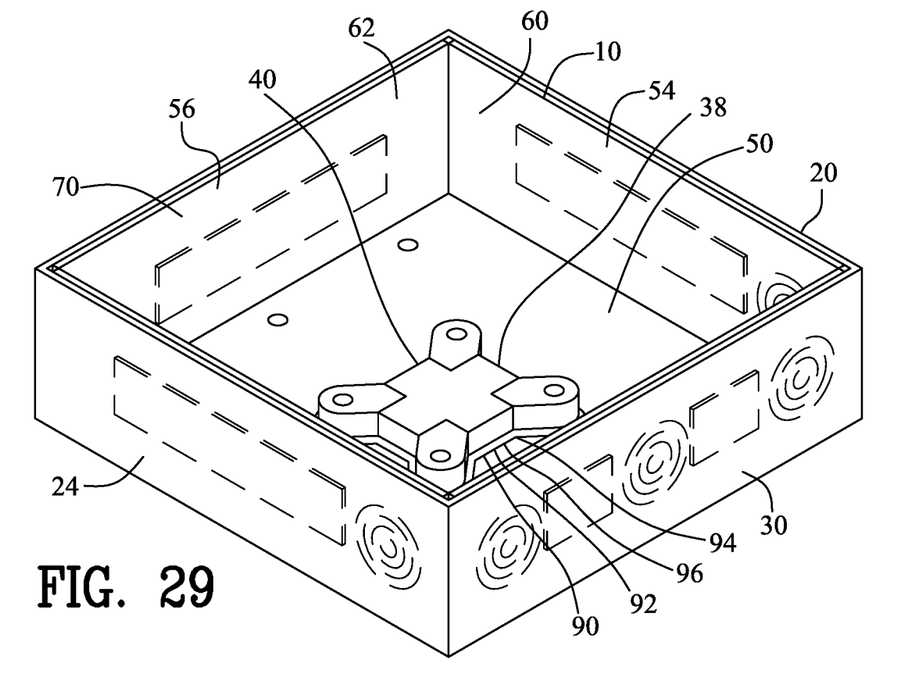
FIG. 29 is a view similar to FIG. 28 illustrating a base aperture in the insulated panel for permitting the electrical component to directly engage with the electrical meter box.

As shown in FIGS. 13 and 29, the insulated panel 10 may further include a base perforation 92 in the insulated base panel 50 for facilitating removal of a base panel portion 94 and creating a base aperture 96. The base aperture 96 permits the insertion of the insulated panel 10 over the meter socket base 40. As such the base aperture 96 permits the insertion of the insulated panel 10 adjacent to the electrical meter box 20 without having to remove the meter socket base 40. Alternatively, the base aperture 96 may be enlarged to accommodate other electrical components 38 that reside within the electrical meter box 20.

The insulated panel 10 may further include an adhesive panel 100 coupled to each of the insulated base panel 50, the insulated first side panel 52, the insulated second side panel 54, the insulated upper panel 56 and the insulated lower panel 58 for coupling the insulated base panel 50, the insulated first side panel 52, the insulated second side panel 54, the insulated upper panel 56 and the insulated lower panel 58 to the interior side wall 32 of the base wall 22, a first side wall 24, a second side wall 26, an upper wall 28 and a lower wall 30 respectively. The adhesive panel 100 may comprise double-sided adhesive tape 102. Alternatively, the adhesive panel 100 may include glue, screws, adhesive spray or other fasteners. A removable protective layer 104 may be coupled to the adhesive panels 100. The removable protective layer 104 is intended to remain abutted with the adhesive panels 100 until the insulated panel 10 is intended to be installed within the electrical meter box 20. As such, the removable protective layer 104 prevents the adhesive on the adhesive panel 100 from being degraded and losing adhesive properties. The removable protective layer 104 is peeled from the adhesive panels 100 before coupling the insulated base panel 50, the insulated first side panel 52, the insulated second side panel 54, the insulated upper panel 56 and the insulated lower panel 58 to the interior side wall 32 of the base wall 22, a first side wall 24, a second side wall 26, an upper wall 28 and a lower wall 30 respectively.

As stated above, the insulated panels 10 is constructed of a nonelectrical conductive material 110. More specifically, the insulated base panel 50, the insulated first side panel 52, the insulated second side panel 54, the insulated upper panel 56 and the insulated lower panel 58 are constructed of a non-electrical conductive material 110. For example, the insulated panel 10 may be constructed of neoprene rubber, silicon coated fiberglass, heat resistant vinyl, plyvinyl chloride or synthetic rubber. Preferably, the insulated panel 10 is constructed of a flexible material, however, the insulated panel 10 may be constructed of a rigid material. The insulated panel 10 may further include an insulated front panel that is positioned adjacent to the front closure of the electrical meter box 20. As similarly, mentioned above an adhesive may coupled the insulated front panel to the front closure. In other embodiments, the insulated panel 10 may include spray-on rubber coating.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

The invention claimed is:

1. An insulated panel for an electrical meter box, the electrical meter box having a base wall, a first side wall, a second side wall, an upper wall and a lower wall, each of the walls include an interior side wall and an exterior side wall, the electrical meter box defining an meter box chamber and housing electrical components, the insulated panel comprising:

an insulated base panel positioned adjacent to the interior side wall of the base wall;

an insulated first side panel positioned adjacent to the interior side wall of the first side wall;

an insulated second side panel positioned adjacent to the interior side wall of the second side wall;

an insulated upper panel positioned adjacent to the interior side wall of the upper wall;

an insulated lower panel positioned adjacent to the interior side wall of the lower wall;

said insulated base panel, said insulated first side panel, said insulated second side panel, said insulated upper panel and said insulated lower panel defining an insulated box positioned within the electrical meter box defining an insulated chamber; and said insulated box housing the electrical components and preventing electrical continuity of the electrical components through the electrical meter box;

said insulated base panel, said insulated first side panel, said insulated second side panel, said insulated upper panel and said insulated lower panel define an integral one piece unit; and a linear perforation between said insulated base panel with said insulated first side panel, said insulated second side panel, said insulated upper panel and said insulated lower panel for defining a living hinge and aiding in pivoting said insulated first side panel, said insulated second side panel, said insulated upper panel and said insulated lower panel relative to said insulated base panel.

2. The insulated panel as set forth in claim 1, further including a plurality of marks in said insulated base panel for indicating location of anchoring apertures in the electrical meter box.

3. The insulated panel as set forth in claim 1, further including a base perforation in said insulated base panel for facilitating removal of a base panel portion and creating a base aperture.

4. The insulated panel as set forth in claim 1, further including an adhesive panel coupled to each of said insulated base panel, said insulated first side panel, said insulated second side panel, said insulated upper panel and said insulated lower panel for coupling said insulated base panel, said insulated first side panel, said insulated second side panel, said insulated upper panel and said insulated lower panel to the interior side wall of the base wall, the first side wall, the second side wall, the upper wall and the lower wall respectively.

5. The insulated panel as set forth in claim 4, further including a removable protective layer coupled to said adhesive panels; and said removable protective layer peeled from said adhesive panels before coupling said insulated base panel, said insulated first side panel, said insulated second side panel, said insulated upper panel and said insulated lower panel to the interior side wall of the base wall, the first side wall, the second side wall, the upper wall and the lower wall respectively.

6. The insulated panel as set forth in claim 1, wherein said insulated base panel, said insulated first side panel, said insulated second side panel, said insulated upper panel and said insulated lower panel are constructed of neoprene rubber, silicon coated fiberglass, heat resistant vinyl, plyvinyl chloride or synthetic rubber.

7. The insulated panel as set forth in claim 1, wherein said insulated base panel, said insulated first side panel, said insulated second side panel, said insulated upper panel and said insulated lower panel define a rectangle panel.

8. An insulated panel for an electrical meter box, the electrical meter box having a base wall, a plurality of side walls, each of the plurality of side walls include an interior side wall and an exterior side wall, the electrical meter box defining an meter box chamber and housing electrical components, the insulated panel comprising:

an insulated base panel positioned adjacent to the interior side wall of the base wall;

an insulated side panel positioned adjacent to the interior side wall of one or more of the plurality of side walls;

said insulated base panel and said insulated side panel defining an insulated layer within the electrical meter box;

said insulated layer preventing electrical continuity of the electrical components through the electrical meter box;

said insulated base panel and said insulated side panel define an integral one piece unit; and a linear perforation between said insulated base panel and said insulated side panel for defining a living hinge and aiding in pivoting said insulated side panel relative to said insulated base panel.

9. The insulated panel as set forth in claim 8, further including a plurality of marks in said insulated base panel for indicating location of anchoring apertures in the electrical meter box.

10. The insulated panel as set forth in claim 8, further including a base perforation in said insulated base panel for facilitating removal of a base panel portion and creating a base aperture.

11. The insulated panel as set forth in claim 8, further including an adhesive panel coupled to said insulated base panel and said insulated side panel for coupling said insulated base panel and said insulated side panel to the base wall and one of the plurality of side walls respectively.

12. The insulated panel as set forth in claim 11, further including a removable protective layer coupled to said adhesive panels; and said removable protective layer peeled from said adhesive panels before coupling said insulated base panel and said insulated side panel to the base wall and one of the plurality of side walls respectively.

13. The insulated panel as set forth in claim 8, wherein said insulated base panel and said insulated side panel are constructed of neoprene rubber, silicon coated fiberglass, heat resistant vinyl, plyvinyl chloride or synthetic rubber.

14. An insulated panel for an electrical meter box, the electrical meter box having a base wall, a first side wall, a second side wall, an upper wall and a lower wall, each of the walls include an interior side wall and an exterior side wall, the electrical meter box defining an meter box chamber and housing electrical components, the insulated panel comprising:

an insulated base panel positioned adjacent to the interior side wall of the base wall;

an insulated first side panel positioned adjacent to the interior side wall of the first side wall;

an insulated second side panel positioned adjacent to the interior side wall of the second side wall;

an insulated upper panel positioned adjacent to the interior side wall of the upper wall;

an insulated lower panel positioned adjacent to the interior side wall of the lower wall;

said insulated base panel, said insulated first side panel, said insulated second side panel, said insulated upper panel and said insulated lower panel defining an insulated box positioned within the electrical meter box defining an insulated chamber; and said insulated box housing the electrical components and preventing electrical continuity of the electrical components through the electrical meter box; and a circular perforation in said insulated base panel, said insulated first side panel, said insulated second side panel, said insulated upper panel and said insulated lower panel for facilitating removal of circular panel portions and creating circular apertures.

15. An insulated panel for an electrical meter box, the electrical meter box having a base wall, a first side wall, a second side wall, an upper wall and a lower wall, each of the walls include an interior side wall and an exterior side wall, the electrical meter box defining an meter box chamber and housing electrical components, the insulated panel comprising:

an insulated base panel positioned adjacent to the interior side wall of the base wall;

an insulated first side panel positioned adjacent to the interior side wall of the first side wall;

an insulated second side panel positioned adjacent to the interior side wall of the second side wall;

an insulated upper panel positioned adjacent to the interior side wall of the upper wall;

an insulated lower panel positioned adjacent to the interior side wall of the lower wall;

said insulated base panel, said insulated first side panel, said insulated second side panel, said insulated upper panel and said insulated lower panel defining an insulated box positioned within the electrical meter box defining an insulated chamber; and said insulated box housing the electrical components and preventing electrical continuity of the electrical components through the electrical meter box;

said insulated base panel, said insulated first side panel, said insulated second side panel, said insulated upper panel and said insulated lower panel define an integral one piece unit;

said insulated base panel, said insulated first side panel, said insulated second side panel, said insulated upper panel and said insulated lower panel define a rectangle panel; and a L-shaped notch defined between said insulated first side panel, said insulated second side panel, said insulated upper panel and said insulated lower panel for creating said insulated box upon pivoting said insulated first side panel, said insulated second side panel, said insulated upper panel and said insulated lower panel relative to said insulated base.

16. An insulated panel for an electrical meter box, the electrical meter box having a base wall, a plurality of side walls, each of the plurality of side walls include an interior side wall and an exterior side wall, the electrical meter box defining an meter box chamber and housing electrical components, the insulated panel comprising:

an insulated base panel positioned adjacent to the interior side wall of the base wall;

an insulated side panel positioned adjacent to the interior side wall of one or more of the plurality of side walls;

said insulated base panel and said insulated side panel defining an insulated layer within the electrical meter box;

said insulated layer preventing electrical continuity of the electrical components through the electrical meter box; and a circular perforation in said insulated base panel and said insulated side panel for facilitating removal of circular panel portions and creating circular apertures.

* * * * *